(12) United States Patent
Uchiyama

(10) Patent No.: US 6,222,281 B1
(45) Date of Patent: Apr. 24, 2001

(54) IC CHIP, IC ASSEMBLY, LIQUID CRYSTAL DEVICE, AND ELECTRIC APPARATUS

(75) Inventor: Kenji Uchiyama, Hotaka-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/286,513

(22) Filed: Apr. 6, 1999

(30) Foreign Application Priority Data

Apr. 6, 1998 (JP) .................................................. 10-093682
Dec. 28, 1998 (JP) .................................................. 10-373579

(51) Int. Cl.[7] .......................... H01L 23/48; H01L 23/52; H01L 29/40
(52) U.S. Cl. .......................... 257/780; 773/778; 773/783
(58) Field of Search .................................. 257/780, 781, 257/778, 786, 773, 783

(56) References Cited

U.S. PATENT DOCUMENTS 3,480,412 * 11/1969 Duffek, Jr. et al. . 
5,473,197 * 12/1995 Idaka et al. . 
5,844,320 * 12/1998 Ono et al. . 
5,889,326 * 3/1999 Tanaka .

* cited by examiner

Primary Examiner—Sheila V. Clark
(74) Attorney, Agent, or Firm—Harness, Dickey & Pierce, P.L.C.

(57) ABSTRACT

An IC chip includes a built-in semiconductor and a plurality of bumps exposed to the exterior and provided on a surface, the bumps being pressed and bonded to a substrate or the like using an ACF (Aniosotropic Conductive Film). With respect to at least one of the bumps among the plurality of bumps, the height H of the outer portion is determined to be larger than the height H of the inner portion. When the ACF is pressed by the IC chip, conductive particles in the ACF are prevented from outwardly escaping from the bump by the high outer portion. Therefore, a greater number of conductive particles can be trapped around the bump.

16 Claims, 7 Drawing Sheets

PRIOR ART

IC CHIP, IC ASSEMBLY, LIQUID CRYSTAL DEVICE, AND ELECTRIC APPARATUS

INDUSTRIAL FIELD OF THE INVENTION

The present invention relates to an integral circuit (IC) chip in which a plurality of bumps forms an input terminal and an output terminal, and to an IC chip assembly including the IC chip. Furthermore, the present invention relates to a liquid crystal device including the IC chip. Furthermore, the present invention relates to an electric apparatus including the IC chip.

DESCRIPTION OF THE RELATED ART

Liquid crystal devices are widely used for visual image display units in a variety of electric apparatuses such as mobile phones and video cameras. Such electric apparatus and liquid crystal devices are equipped with a variety of semiconductor components. The "semiconductor component" is an IC chip itself or an IC chip assembly in which an IC chip and a substrate are integrated.

With respect to the above-mentioned IC chip, a bare chip IC which is not packaged, an IC which is packaged and has a terminal on the rear surface, and the like have been known. In addition, with respect to the above-mentioned IC assembly, the following has been known: A chip-on-board (COB) or a multi-chip-module (MCM) in which one or a plurality of IC chips is mounted on one substrate, a chip-on-flexible-printed-circuit (COF) in which an IC chip is mounted on a flexible-printed-circuit (FPC), or the like.

When the above-mentioned IC chip is conductively connected to an object member to be bonded, such as a wiring substrate, there is a method in which after formation of bumps on an input terminal and an output terminal of the IC chip, a conductive connection is achieved by utilizing the bumps. In this method, an anisotropic conductive adhesive such as an anisotropic conductive film (ACF) is intercalated between the IC chip and the object member to be bonded, and the connection is performed using the anisotropic conductive adhesive. In this state, the bumps of the IC chip are conductively connected to an electrode terminal on the object member to be bonded by conductive particles containing in the anisotropic conductive adhesive.

However, as shown in FIG. 10, in a conventional IC chip, out of a plurality of surfaces of bumps 52 which is provided on the active sufrace 51a as an input and output terminal, surfaces 52a to which is applied an anisotropic conductive adhesive is formed to be plane and approximately parallel to an active surface 51a of an IC chip 51.

Generally, when the IC chip 51 is bonded to an object member to be bonded using the anisotropic conductive adhesive, the IC chip 51 is pressed to the object member to be bonded by intercalating the anisotropic conductive adhesive. The pressed anisotropic conductive adhesive is extruded laterally. When the surfaces 52a of the bumps 52 are a plane and are parallel to the active surface 51a of the IC chip 51 as described above, the anisotropic conductive adhesive, which is pressed by the surface 52a of the bump 52, spreads so as to escape from the bump 52. Therefore, conductive particles around the surfaces 52a of the bumps 52 decrease, so that satisfactory conductivity is not obtained.

The present invention is performed in view of the above-described problem. An object of the present invention is to prevent conductive particles in an anisotropic conductive adhesive from escaping from surfaces of bumps of an IC chip, and to retain more numerous conductive particles around the surfaces of the bumps.

(1) To this end, an IC chip in accordance with the present invention includes a built-in semiconductor and a plurality of bumps exposed to the exterior, and provided on a surface, the bumps being pressed and bonded to an object member to be bonded using an anisotropic conductive adhesive; wherein a mounting surface of the bump opposed to the object member to be bonded has a larger height in the outward direction of the IC chip than a height in the inward direction thereof.

With respect to the IC chip, the height of the outer portion of the bump is larger than the height of the inner portion thereof. Thus, when an anisotropic conductive adhesive is pressed by the IC chip, conductive particles in the anisotropic conductive adhesive are prevented from outwardly moving toward the outside of the IC chip by the high outer portion of the bump. As a result, numerous conductive particles can remain around the bump so that substantial conductivity can be obtained.

In addition, "an anisotropic conductive adhesive" is a conductive adhesive including conductive particles, and is not limited to a particular adhesive material in practice. An anisotropic conductive film (ACF) which has the overall form of a film, an anisotropic conductive adhesive which has the overall form of a paste and the like are exemplified.

In addition, "an object to be bonded" is an arbitrary member to which an IC chip is mounted. A variety of members such as a hard wiring substrate, a soft wiring substrate, a flexible wiring substrate, and a transmissive substrate for a liquid crystal panel are exemplified.

(2) With respect to the above-described IC chip, a difference (H-h) between the outward height H of the bump and the inward height h thereof is preferably smaller than a diameter of a conductive particle in the anisotropic conductive adhesive. Thus, numerous conductive particles can be trapped around the bump.

(3) With respect to the above—described IC chip, the bump may be formed so as to include a concave portion on a mounting surface opposed to the object member to be bonded. With this form, conductive particles can remain in the concave portion, so that a greater number of conductive particles can be trapped around the bump.

(4) An IC assembly in accordance with the present invention includes an IC chip and a substrate for mounting the IC chip using an anisotropic conductive adhesive; wherein the IC chip is an IC chip according to any one of the paragraphs (1) to (3) above. With this IC assembly, numerous conductive particles can remain around the bump in the same way as described above in paragraphs (1) to (3), which explain the IC chip. Therefore, substantial conductivity can be obtained.

(5) Next, a liquid crystal device in accordance with the present invention includes a liquid crystal panel including a pair of substrates containing a liquid crystal sandwiched therebetween, and an IC for driving the liquid crystal directly or indirectly connected to the liquid crystal panel using an anisotropic conductive adhesive; wherein the IC for driving the liquid crystal is composed of the IC chip according to any one of the paragraphs (1) to (3). With this liquid crystal, numerous conductive particles can be retained around the bump in the same way as described above in paragraphs (1) to (3), which explain the IC chip. Therefore, substantial conductivity can be obtained.

In addition, "a direct connection of the IC for driving the liquid crystal to the liquid crystal panel" means that after mounting the IC for driving the liquid crystal to an intermediate substrate other than the liquid crystal panel, the IC for driving the liquid crystal is connected to the liquid crystal panel by connecting the intermediate substrate to the liquid crystal panel.

(6) Next, an electric apparatus in accordance with the present invention includes an IC chip wherein the IC chip is an IC chip according to any one of paragraphs (1) to (3). With this electric apparatus, numerous conductive particles can be retained around the bump in the same way as described above in paragraphs (1) to (3), which explain the IC chip. Therefore, substantial conductivity can be obtained.

DETAILED DESCRIPTION OF THE PREFERRED EMBODIMENTS

Figure 1:
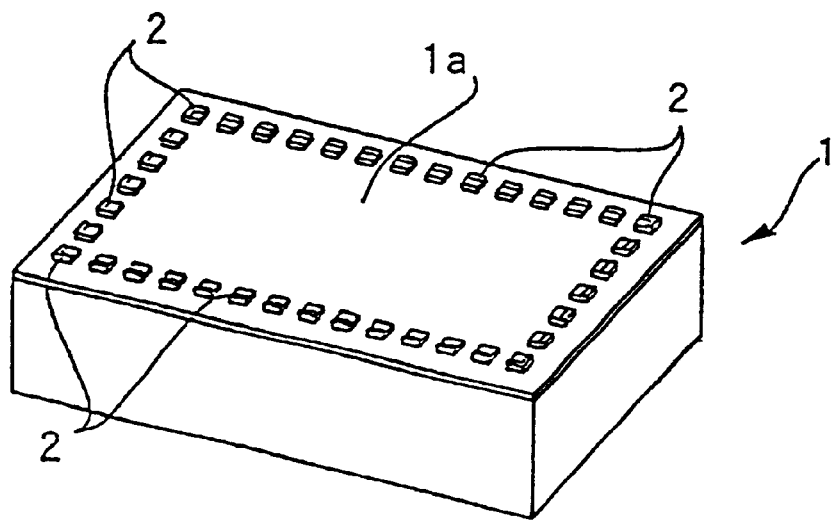
FIG. 1 is an perspective view of an IC chip according to an embodiment of the present invention.

FIG. 1 shows an IC chip according to an embodiment of the present invention. A circuit which is arranged so as to perform a predetermined function is built into an IC chip 1.

The IC chip 1 is formed as an IC for driving a liquid crystal in a liquid crystal device or the like. A plurality of bumps 2 is provided on an active surface la of the IC chip 1 as an input terminal or an output terminal of the internal circuit.

Figure 2:
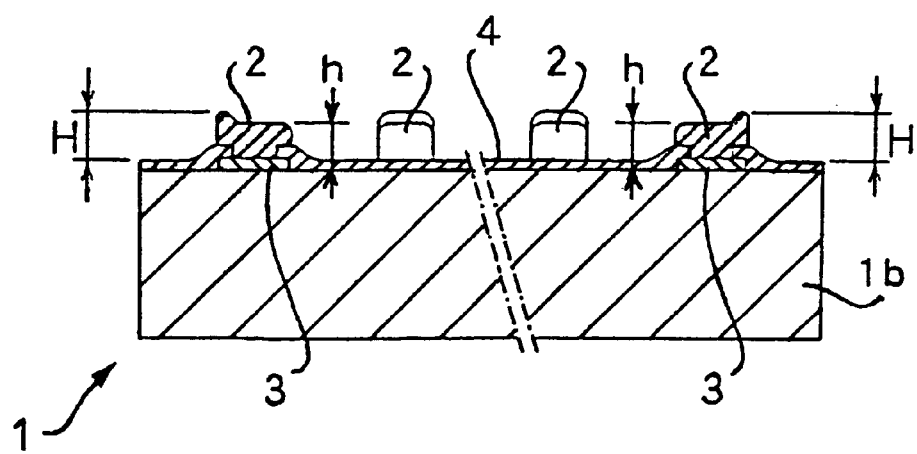
FIG. 2 is a cross-sectional view of the IC chip shown in FIG. 1.

With respect to the IC chip 1 shown in FIG. 2, for example, aluminum electrodes 3 are formed at appropriate areas of a surface of a chip body 1b. Passivation films 4 are provided on the surface of the chip body 1b other than the aluminum electrodes 3 in such a manner that the aluminum electrodes 3 are open. Then, bumps 2 are formed on the aluminum electrodes 3 by selective plating of gilding. In FIGS. 1 and 2, the bumps 2 are illustrated enlarged compared with the size of the IC chip 1 in order to clearly show the configuration of the bump 2 or the like.

In addition, the arrangement of the bumps on the IC chip is not limited to the arrangement shown in FIG. 1. The bumps may be provided along two edges of the IC chip, or may have a staggered arrangement.

Figure 3:
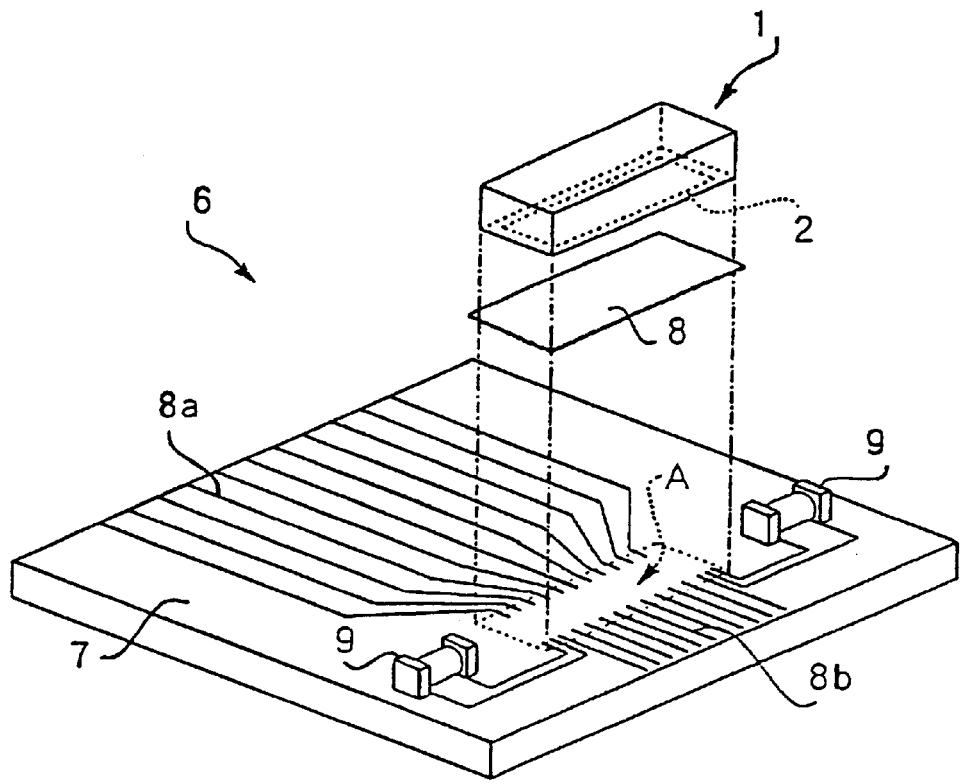
FIG. 3 is an perspective view of an IC assembly according to an embodiment of the present invention.

FIG. 3 shows an embodiment of the use of the IC chip 1, that is, a chip-on-board (CC)B) type IC assembly 6. The IC chip 1 is bonded to a predetermined region for mounting the IC chip A on a printed substrate 7, which is an object member to be bonded, using an anisotropic conductive film (ACF) 8 as an anisotropic conductive adhesive, so that the IC assembly 6 is formed. As shown in FIG. 3, circuit parts 9 such as a chip resistor or a chip capacitor are arranged around the IC chip 1, if necessary.

Figure 4:
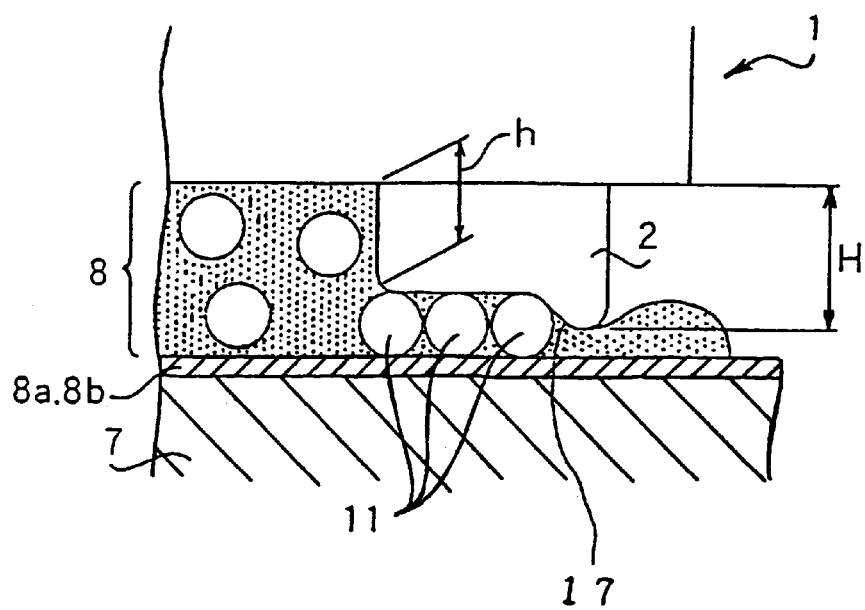
FIG. 4 is an enlarged cross-sectional view of an essential part of the IC assembly shown in FIG. 3.

When the adhesive which forms ACF 8 includes a thermosetting resin, the IC chip 1 is bonded to the printed substrate 7 by inserting the ACF 8 between the IC chip 1 and the printed substrate 7, by heating them, and by pressing them. As shown in FIG. 4, the bumps 2 under the IC chip 1 are conductively connected to electrode terminals 8a and 8b on the printed substrate 7 by conductive particles 11 in the ACF 8.

As shown in FIG. 4, in the present embodiment, the height H of the outer portion of the bump 2 is larger than the heights of the inner portion thereof. Thus, when the ACF 8 is pressed to the printed substrate 7 by the IC chip 1, substantial amount of resin in the adhesive which forms the ACF 8 are pushed outwardly of the IC chip 1. However, the conductive particles 11, which tend to be moved toward the outside of the region in which the IC chip 1 is mounted, are prevented from flowing out by an interior wall 17 of the outer portion of the bump 2 having a large height. Therefore, numerous conductive particles 11 included in the ACF 8 remain between the bump 2 and the electrode 8a or between the bump 2 and the electrode 8b. Thus, superior conductivity can be obtained.

The difference between the height of the outer portion of the bump 2 and the height of the inner portion thereof (H-h) is preferably smaller than the diameter of the conductive particle 11 in the ACF 8. When the difference (H-h) is larger the diameter of the conductive particle 11, a gap between the bump 2 and the electrode 8a or between the bump 2 and the electrode 8b becomes larger than the diameter of the conductive particle 11. Thus, the bump 2 cannot satisfactorily trap the particles 11.

Figure 5:
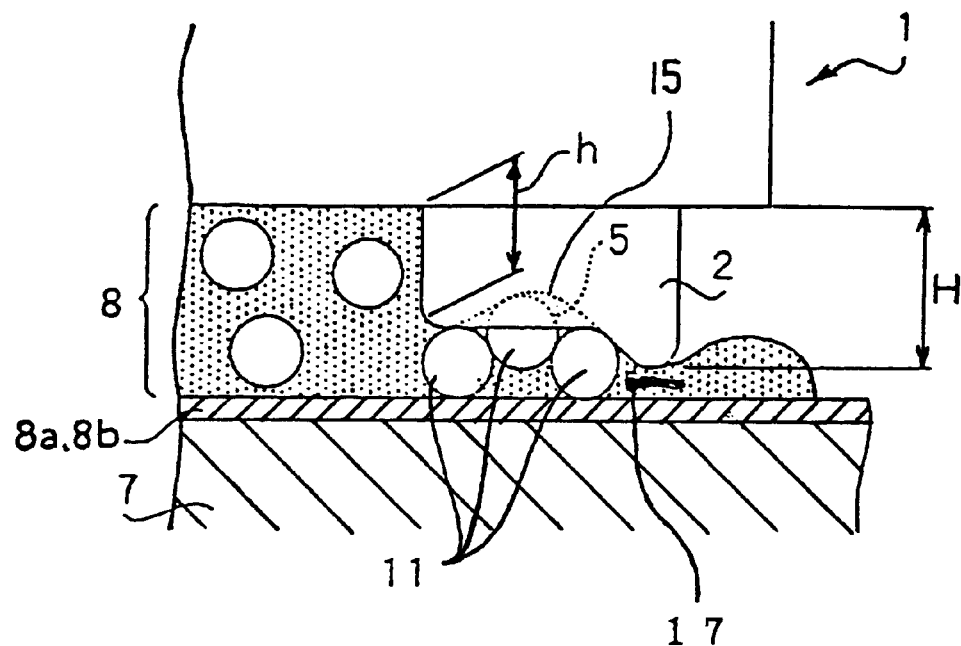
FIG. 5 is a cross-sectional view of a bump according to a modified embodiment of the present invention.

FIG. 5 shows a bump 2 according to a modified embodiment of the present invention. With respect to the bump 2, a concave portion 5 is formed on a surface to which an ACF 8 is attached and to which an electrode 8a or an electrode 8b is opposed as an object member to be bonded to the bump 2. The concave portion 5 can prevent the conductive particles 11 from flowing out at an interior wall 17 of the outer portion of the bump 2 having a large height. Further, numerous conductive particles 11 can remain and accumulate around the bump 2 due to a dimple 15 at the concave portion 5; therefore, superior conductivity can be obtained.

Figure 6:
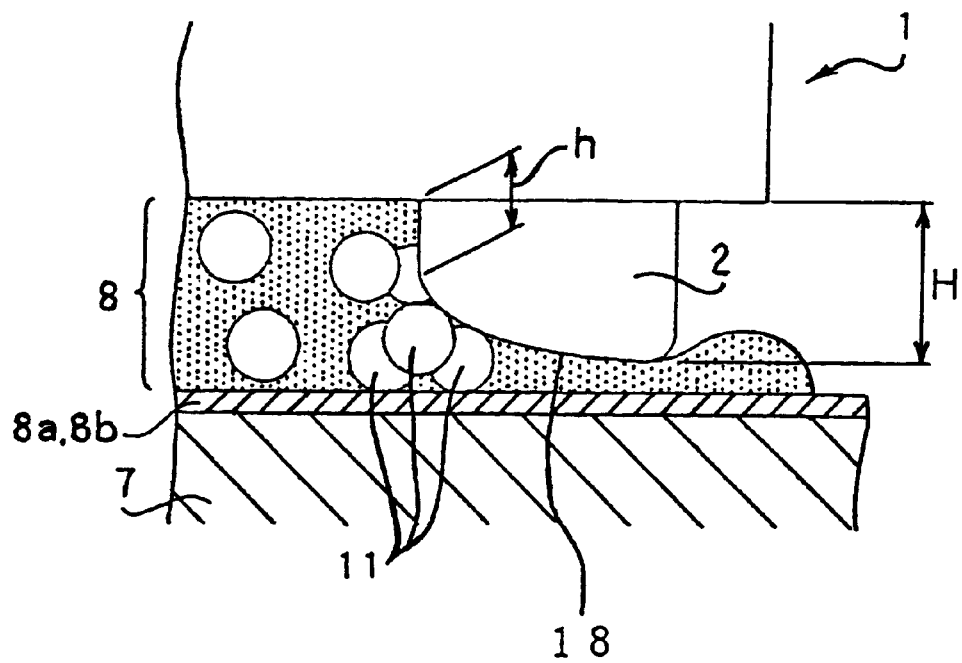
FIG. 6 is a cross-sectional view of a bump according to another modified embodiment of the present invention.

FIG. 6 shows a bump 2 according to another modified embodiment of the present invention. With respect to the bump 2, a surface to which an ACF 8 is attached and to which an electrode 8a or an electrode 8b, which is an object member to be bonded, is opposed to the bump 2 is outwardly convexed. Numerous conductive particles 11 can remain around the inner portions of the bump 2 having a small height due to a taper portion 18 of the convex portion; therefore, superior conductivity can be obtained.

Figure 7:
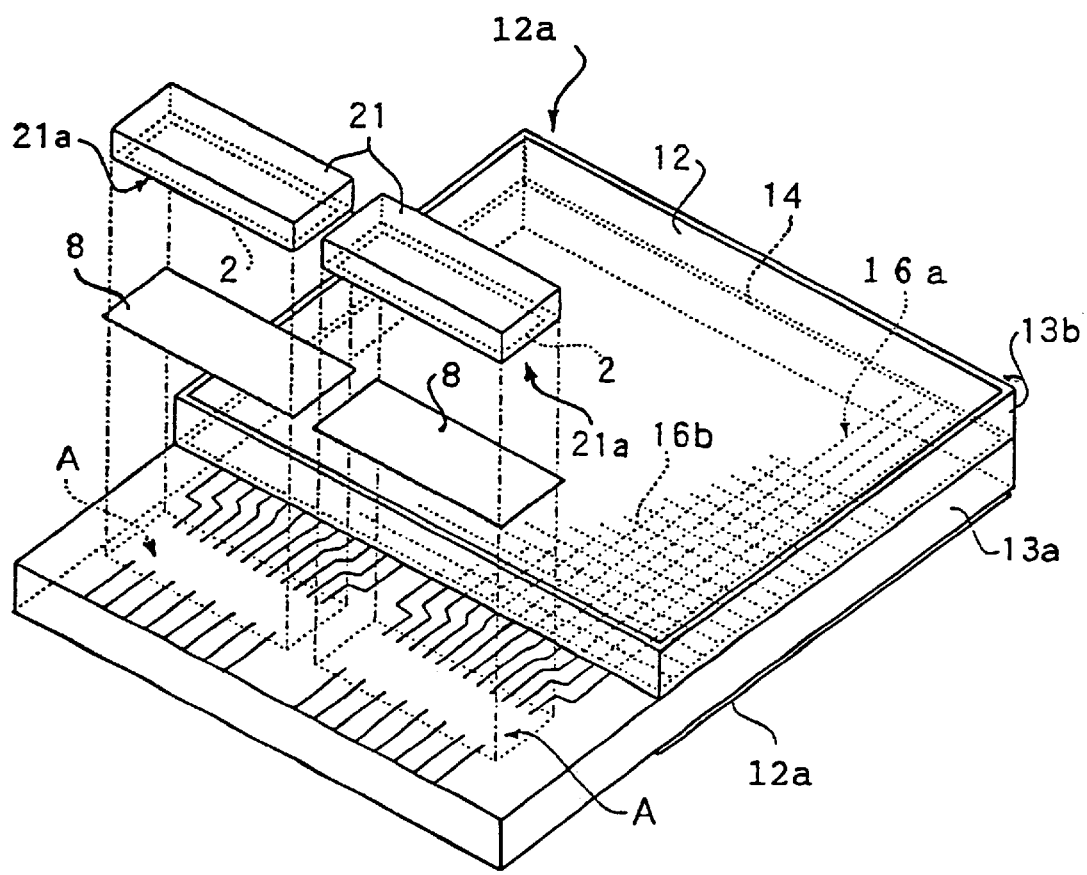
FIG. 7 is an perspective view of a liquid crystal device according to an embodiment of the present invention.

FIG. 7 shows a liquid crystal device as another embodiment of an IC assembly using an IC chip shown in FIG. 1. The liquid crystal device 12 includes a pair of transmissive substrates 13a and 13b, which are opposed to each other. A seal member 14 is printed to be a rectangular frame configuration on one of these substrates 13a and 13b. The substrates 13a and 13b are bonded together by the seal member 14. Liquid crystal is filled in a gap between the substrate 13a and the substrate 13b, that is, in a cell gap. In addition, a plurality of linear transmissive electrodes 16a is formed on the inner surface of the substrate 13a by a photolithography process. On the other hand, a plurality of linear transmissive electrodes 16b is formed on the inner surface of the substrate 13b by a photolithography process.

Thus, a liquid crystal panel in which a pair of the substrate 13a and 13b containing liquid crystal sandwiched therebetween is formed. With respect to the liquid crystal panel, the substrate 13a is longer than the substrate 13b to form a stretched portion. Regions for mounting IC chips A are provided on the stretched portion in order to mount ICs for driving the liquid crystal 21, which are IC chips.

The transmissive electrodes 16a, which are formed on the substrate 13a, are directly elongated to the stretched portion of the substrate 13a, and end portions thereof form land in the regions for mounting IC chips A. In addition, the transmissive electrode 16b formed on the substrate 13b is connected to a conductive line on the stretched portion of the substrate 13a via a conductive member (not shown), which is provided between the substrate 13a and the substrate 13b. The end portion of the conductive line forms a land in the regions for mounting the IC chips A. In the present embodiment, the stretched portion of the transmissive substrate 13a is an object member to be bonded for bonding the ICs for driving the liquid crystal 21, that is, the IC chips.

After mounting the ICs for driving the liquid crystal 21 on the regions for mounting IC chips A, polarizing plates 12a are bonded to the outer surface of the transmissive substrate 13a and the outer surface of the transmissive substrate 13b. In addition, a backlight is provided at the outside of any one of the transmissive substrate 13a and the transmissive substrate 13b, if necessary. The IC for driving the liquid crystal 21 is a semiconductor device, which has a function of transmitting a scanning signal and a data signal to the transmissive electrode 16a and the transmissive electrode 16b. A plurality of bumps 2 is provided on active surfaces 21a (lower surfaces shown in FIG. 7) in order to transmit or receive signals to or from an external circuit, or in order to receive a voltage applied from an external source. With respect to the bump 2 shown in FIG. 4, the height H of the outer portion of the bump 2 is larger than the height h of the inner portion thereof. Therefore, when heating and compression is performed to an ACF 8 by the IC for driving the liquid crystal 21, conductive particles 11 included in the ACF 8 are prevented from moving outwardly from the periphery of the bump 2. Thus, numerous conductive particles 11 can remain between the bumps 2 and the lands in the regions for mounting the IC chips A.

Figure 8:
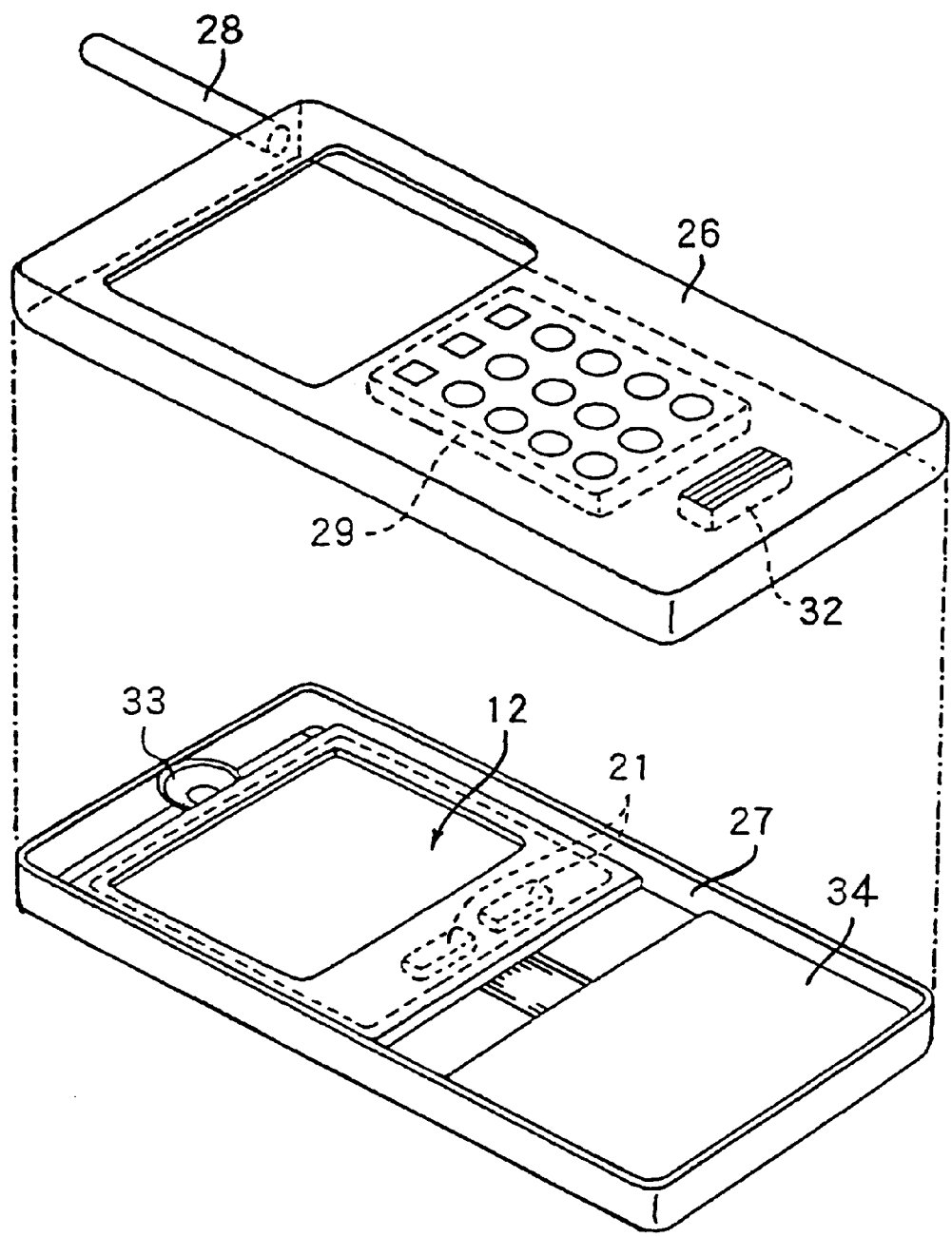
FIG. 8 is an perspective view of assembly of an electronic apparatus according to an embodiment of the present invention.

FIG. 8 shows a mobile phone according to an embodiment of the present invention, which is an electronic apparatus including an IC chip in accordance with the present invention. The mobile phone includes an upper housing 26 and a lower housing 27. The upper housing 26 includes an antenna 28 for transmission and reception, a keyboard 29, and a microphone 32. The lower housing 27 includes a liquid crystal device 12 shown in FIG. 7, for example, a speaker 33 and a circuit substrate 34.

Figure 9:
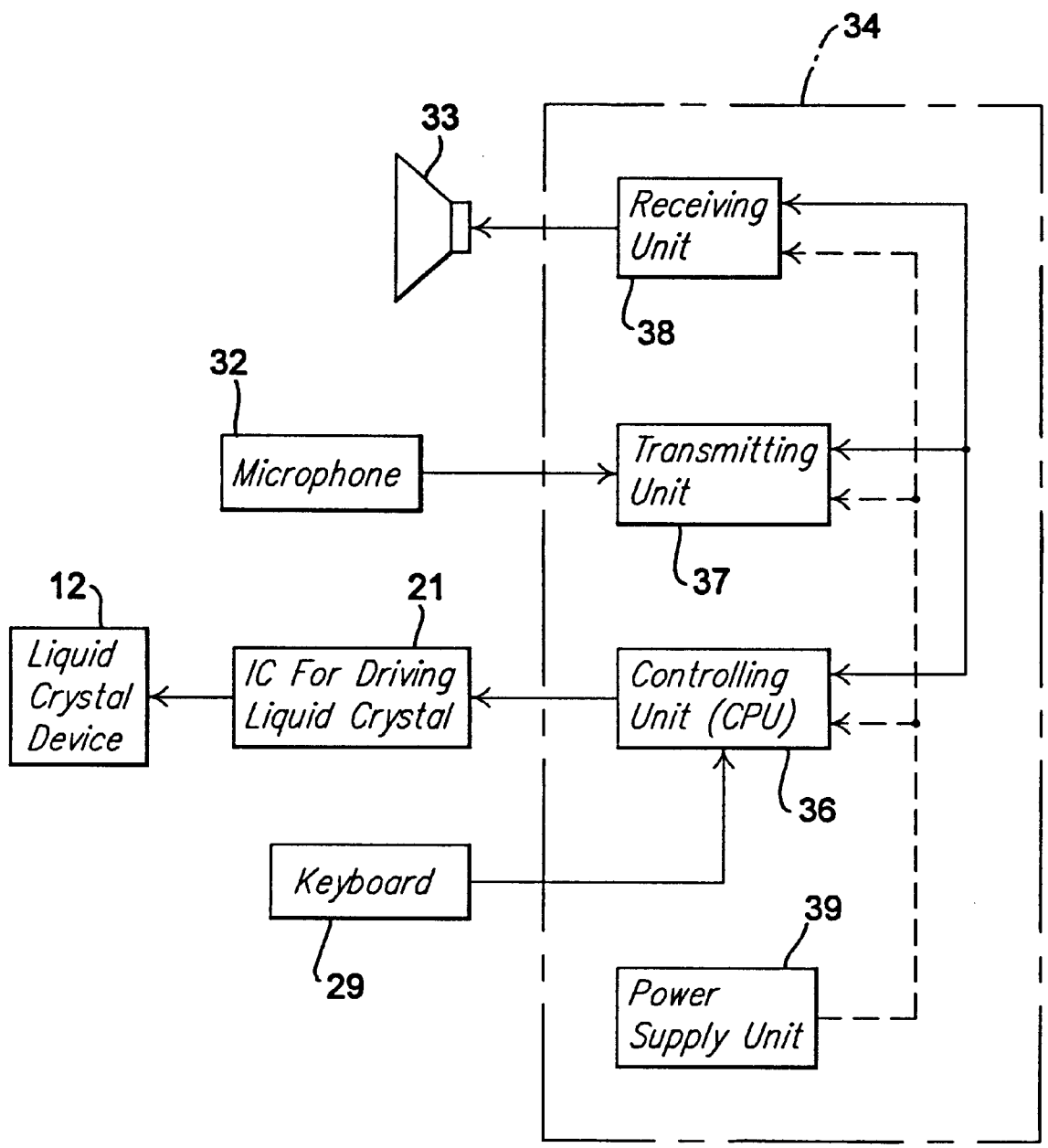
FIG. 9 is a block diagram showing an example of an electric control system used for the electronic apparatus shown in FIG. 8.
Figure 10:
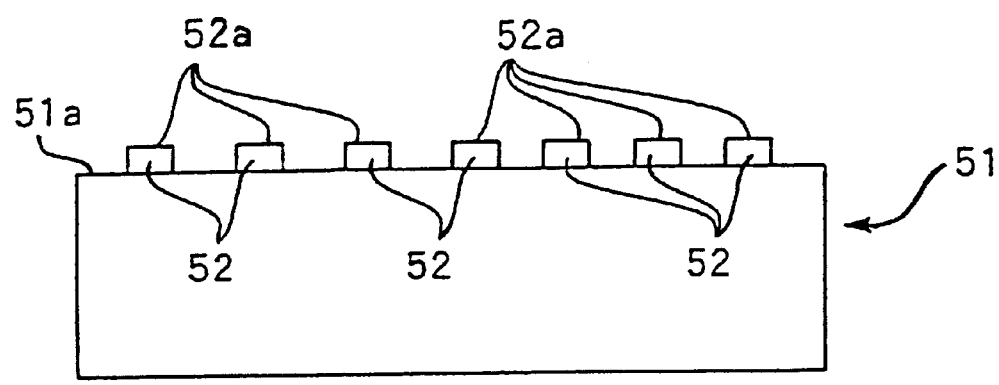
FIG. 10 is a front view of an example of a conventional IC chip.

As shown in FIG. 9, a receiving unit 38 connected to the input terminal of the speaker 33, a transmitting unit 37 connected to the output terminal of the microphone 32, a controlling unit 36 having a central processing unit (CPU), and a power supply unit 39 which applies electric power to each unit are provided on the circuit substrate 34. The controlling unit 36 reads signals of the transmitting unit 37 and the receiving unit 38, and based on it, the controlling unit 36 transmits information to the ICs for driving the liquid crystal 21, so that visible information is displayed on the effective display area of the liquid crystal device 12.

While the present invention has been described with respect to what is at present considered to be the preferred embodiment, it is to be understood that the invention is not limited to the disclosed embodiments. The invention covers various modifications and equipment arrangements included within the spirit and scope of the invention disclosed in the claims.

For example, an IC chip in accordance with the present invention may have an arbitrary configuration other than the configuration shown in FIG. 1. An IC assembly in accordance with the present invention is not limited to the COB type semiconductor assembly shown in FIG. 3, but may be a chip-on-flexible-printed-substrate (COF) type assembly. Furthermore, the IC assembly is not limited to the liquid crystal device shown in FIG. 7, but may be another arbitrary assembly to which an IC chip having a bump is bonded by an anisotropic conductive adhesive. In addition, a liquid crystal device in accordance with the present invention is not limited to the COG type liquid crystal device shown in FIG. 7 in which an IC for driving a liquid crystal is directly mounted on a liquid crystal panel substrate, but may have a variety of configurations. Furthermore, although FIG. 8 shows a mobile phone as one example of an electric apparatus, the present invention can obviously be applied to a variety of electric apparatuses such as a video camera.

With respect to an IC chip, an IC assembly, a liquid crystal device, and an electronic apparatus in accordance with the present invention, the height of the outer portion of a bump is larger than the height of the inner portion thereof. Therefore, when an anisotropic conductive adhesive is pressed by the IC chip, conductive particles in the anisotropic conductive adhesive can be prevented from moving outwardly from the region for mounting the IC chip by the high outer portion of the bump. Thus, numerous conductive particles can remain around the bump, so that substantial conductivity can be obtained.

What is claimed is:

1. An IC chip comprising:
a built-in semiconductor; and
a plurality of bumps on a surface of said chip and exposed to an exterior thereof, said surface being press bonded to an object member to be bonded using an anisotropic conductive adhesive;
wherein a mounting surface of the bump opposed to the object member to be bonded has an inner surface in an inward direction of the chip and an outer surface in an outward direction of the chip, said outer surface of said bump having a larger height than said inner surface.

2. An IC chip according to claim 1, wherein a difference (H-h) between the outward height H of the bump and the inward height h thereof is smaller than a diameter of a conductive particle in the anisotropic conductive adhesive.

3. An IC chip according to claim 1, wherein the bump comprises a concave portion on the mounting surface opposed to the object member to be bonded.

4. An IC assembly comprising:
an IC chip; and
a substrate for mounting the IC chip using an anisotropic conductive adhesive;
wherein the IC chip is the IC chip according to claim 1.

5. A liquid crystal device, comprising:
a liquid crystal panel comprising a pair of substrates containing a liquid crystal sandwiched therebetween; and
an IC for driving the liquid crystal directly or indirectly connected to the liquid crystal panel using an anisotropic conductive adhesive;

wherein the IC for driving the liquid crystal is the IC chip according to claim 1.

6. An electric apparatus, comprising an IC chip wherein the IC chip is the IC chip according to claim 1.

7. An integrated circuit chip comprising:

a body having a surface; and a plurality of bumps coupled about a perimeter of said surface, each of said bumps including a mounting surface having a greater height relative to said surface at an outboard edge than at an inboard edge.

8. The integrated circuit chip of claim 7 wherein said mounting surface includes a concave portion between said outboard edge and said inboard edge.

9. The integrated circuit chip of claim 7 wherein said mounting surface includes a convex configuration between said outboard edge and said inboard edge.

10. The integrated circuit chip of claim 7 wherein said mounting surface includes a generally planar portion extending from said inboard edge to a protuberance proximate said outboard edge.

11. The integrated circuit chip of claim 7 wherein a difference between a height of said outboard edge and a height of said inboard edge is less than a diameter of a conductive particle in an anisotropic conductive film used to bond said body to a substrate.

12. An integrated circuit comprising:

an integrated circuit chip including a plurality of bumps coupled to a surface thereof, said bumps including an inboard edge and an outboard edge with a mounting surface extending therebetween, said outboard edge having a greater height relative to said surface than said inboard edge;

an anisotropic conductive film disposed on said surface and said bumps; and a substrate press bonded to said bumps of said integrated circuit chip by way of said anisotropic conductive film;

wherein said outboard edge of said bumps prevents conductive particles of said anisotropic conductive film from passing outwardly thereof.

13. The integrated circuit of claim 12 wherein said mounting surface includes a concave portion between said outboard edge and said inboard edge.

14. The integrated circuit of claim 12 said mounting surface includes a convex configuration between said outboard edge and said inboard edge.

15. The integrated circuit of claim 12 wherein said mounting surface includes a generally planar portion extending from said inboard edge to a protuberance proximate said outboard edge.

16. The integrated circuit of claim 12 wherein a difference between a height of said outboard edge and said inboard edge is less than a diameter said conductive particles.

* * * * *

UNITED STATES PATENT AND TRADEMARK OFFICE
CERTIFICATE OF CORRECTION

PATENT NO. : 6,222,281 B1
DATED : April 24, 2001
INVENTOR(S) : Kenji Uchiyama

It is certified that error appears in the above-identified patent and that said Letters Patent is hereby corrected as shown below:

Column 1,
Line 42-43, "containing" should be -- contained --.

Column 3,
Line 14, "an" should be -- a --.
Line 18, "an" should be -- a --.
Line 27, "an" should be -- a --.
Line 29, "an" should be -- a --.
Line 64, "(CC)B)" should be -- (COB) --.

Column 8,
Line 27, after "diameter" insert -- of --.

Signed and Sealed this

Eighteenth Day of September, 2001

Attest:

NICHOLAS P. GODICI
Attesting Officer
Acting Director of the United States Patent and Trademark Office